(12) United States Patent
Hashimoto et al.

(10) Patent No.: US 12,412,880 B2
(45) Date of Patent: *Sep. 9, 2025

(54) SEMICONDUCTOR DEVICE HAVING DOLMEN STRUCTURE AND METHOD FOR MANUFACTURING SAME

(71) Applicant: Resonac Corporation, Tokyo (JP)

(72) Inventors: Shintaro Hashimoto, Tokyo (JP);
Kouhei Taniguchi, Tokyo (JP);
Tatsuya Yahata, Tokyo (JP);
Yoshinobu Ozaki, Tokyo (JP)

(*) Notice: Subject to any disclaimer, the term of this patent is extended or adjusted under 35 U.S.C. 154(b) by 340 days.

This patent is subject to a terminal disclaimer.

(21) Appl. No.: 17/438,943

(22) PCT Filed: Apr. 25, 2019

(86) PCT No.: PCT/JP2019/017713
§ 371 (c)(1),
(2) Date: Sep. 14, 2021

(87) PCT Pub. No.: WO2020/217404
PCT Pub. Date: Oct. 29, 2020

(65) Prior Publication Data
US 2022/0157802 A1   May 19, 2022

(51) Int. Cl.
*H01L 25/00* (2006.01)
*H01L 23/00* (2006.01)
(Continued)

(52) U.S. Cl.
CPC .............. *H01L 25/50* (2013.01); *H01L 24/83* (2013.01); *H01L 25/0657* (2013.01);
(Continued)

(58) Field of Classification Search
CPC ..... H01L 25/50; H01L 25/0657; H01L 25/18; H01L 2224/2919; H01L 2224/45099;
(Continued)

(56) References Cited

U.S. PATENT DOCUMENTS 5,499,128 A    3/1996   Hasegawa et al.
5,963,794 A   10/1999   Fogal et al.
(Continued)

FOREIGN PATENT DOCUMENTS

CN    103178036    6/2013
CN    105143380   12/2015
(Continued)

OTHER PUBLICATIONS

International Search Report dated Jul. 9, 2019 for PCT/JP2019/017713.
(Continued)

*Primary Examiner* — Teresa M. Arroyo
(74) *Attorney, Agent, or Firm* — ISOEI PATENT & LAW FIRM

(57) ABSTRACT

A semiconductor device having a dolmen structure, includes: a substrate; a first chip disposed on the substrate; a plurality of support pieces disposed around the first chip, on the substrate; and a bonding adhesive piece-attached chip supported by the plurality of support pieces and disposed to cover the first chip, in which the bonding adhesive piece-attached chip includes a second chip, and a bonding adhesive piece provided on one surface of the second chip, and a shear strength of the support pieces and the bonding adhesive piece-attached chip at 250° C. is 3.2 MPa or more.

16 Claims, 10 Drawing Sheets

(51) Int. Cl.
  *H01L 25/065* (2023.01)
  *H01L 25/18* (2023.01)
(52) U.S. Cl.
  CPC .............. *H01L 25/18* (2013.01); *H01L 24/32* (2013.01); *H01L 24/73* (2013.01); *H01L 2224/32145* (2013.01); *H01L 2224/32225* (2013.01); *H01L 2224/73265* (2013.01); *H01L 2224/83385* (2013.01); *H01L 2224/8349* (2013.01); *H01L 2225/0651* (2013.01); *H01L 2225/06562* (2013.01)
(58) Field of Classification Search
  CPC ... H01L 2224/83862; H01L 2224/8349; H01L 2224/32145; H01L 2224/32225; H01L 2224/73265; H01L 2224/83385; H01L 23/3121; H01L 24/85; H01L 24/92; H01L 24/29; H01L 24/32; H01L 24/73; H01L 24/83; H01L 2225/0651; H01L 2225/06562; H01L 2225/06503
  USPC ......................................................... 257/777
  See application file for complete search history.

(56) References Cited

U.S. PATENT DOCUMENTS

| | | | |
|---|---|---|---|
| 7,459,776 B1 | 12/2008 | St. Amand et al. | |
| 7,550,832 B2 | 6/2009 | Weng et al. | |
| 7,859,119 B1 | 12/2010 | St. Amand et al. | |
| 9,721,924 B2 | 8/2017 | Lee | |
| 2003/0038374 A1* | 2/2003 | Shim | H01L 23/3128 257/723 |
| 2003/0047798 A1* | 3/2003 | Halahan | H01L 23/13 257/E21.597 |
| 2005/0133932 A1 | 6/2005 | Pohl et al. | |
| 2005/0256241 A1* | 11/2005 | Sachdev | H01L 23/433 257/E23.09 |
| 2006/0043559 A1* | 3/2006 | Chow | H01L 25/0652 257/E21.705 |
| 2007/0181990 A1 | 8/2007 | Huang et al. | |
| 2007/0232026 A1* | 10/2007 | Apanius | H01L 24/81 438/460 |
| 2008/0029885 A1 | 2/2008 | Meir et al. | |
| 2010/0035381 A1* | 2/2010 | Yoshimura | H01L 21/563 438/109 |
| 2010/0219507 A1* | 9/2010 | Misumi | H01L 24/32 438/464 |
| 2011/0175222 A1* | 7/2011 | Kim | H01L 23/3128 257/737 |
| 2011/0256666 A1 | 10/2011 | Sugo et al. | |
| 2012/0181673 A1 | 7/2012 | Pagaila et al. | |
| 2012/0263946 A1* | 10/2012 | Mitsukura | H01L 21/6836 428/522 |
| 2013/0062782 A1* | 3/2013 | Yoshimura | H01L 25/50 257/777 |
| 2013/0270717 A1 | 10/2013 | Ko et al. | |
| 2014/0167291 A1* | 6/2014 | Nam | H01L 25/0657 257/777 |
| 2016/0276223 A1* | 9/2016 | Priewasser | H01L 21/6835 |
| 2017/0323868 A1* | 11/2017 | Park | H01L 23/3185 |
| 2020/0024891 A1 | 1/2020 | Abe et al. | |
| 2022/0157802 A1 | 5/2022 | Hashimoto et al. | |
| 2023/0187370 A1 | 6/2023 | Chen et al. | |

FOREIGN PATENT DOCUMENTS

| | | |
|---|---|---|
| JP | 2002-222889 | 8/2002 |
| JP | 2003-124433 | 4/2003 |
| JP | 2006-005333 | 1/2006 |
| JP | 2010-206136 | 9/2010 |
| JP | 2013-127014 | 6/2013 |
| JP | 2013-131557 | 7/2013 |
| JP | 2015-176906 | 10/2015 |
| JP | 2016-021585 | 2/2016 |
| JP | 2016-216562 | 12/2016 |
| JP | 2017-515306 | 6/2017 |
| JP | 2019-012841 | 1/2019 |
| TW | 201038699 | 11/2010 |
| TW | 201640642 | 11/2016 |

OTHER PUBLICATIONS

International Preliminary Report on Patentability with Written Opinion dated Nov. 4, 2021 for PCT/JP2019/017713.
Soei Patent and Law Firm, Statement of Related Matters, dated Dec. 13, 2024.
International Search Report dated Jul. 9, 2019 for PCT/JP2019/017701.
International Search Report dated Jul. 28, 2020 for PCT/JP2020/017728.
International Search Report dated Jul. 9, 2019 for PCT/JP2019/017688.
International Search Report dated Jul. 9, 2019 for PCT/JP2019/017692.
International Search Report dated Jul. 21, 2020 for PCT/JP2020/017731.
International Search Report dated Jul. 28, 2020 for PCT/JP2020/017740.
International Preliminary Report on Patentability with Written Opinion dated Nov. 4, 2021 for PCT/JP2019/017701.
International Preliminary Report on Patentability with Written Opinion dated Nov. 4, 2021 for PCT/JP2020/017728.
International Preliminary Report on Patentability with Written Opinion dated Nov. 4, 2021 for PCT/JP2019/017688.
International Preliminary Report on Patentability with Written Opinion dated Nov. 4, 2021 for PCT/JP2020/017731.
International Preliminary Report on Patentability with Written Opinion dated Nov. 4, 2021 for PCT/JP2019/017692.
International Preliminary Report on Patentability with Written Opinion dated Nov. 4, 2021 for PCT/JP2020/017740.

* cited by examiner (a)

(b)

(c)

(a)

(b)

(a)

(b)

(c)

(d)

SEMICONDUCTOR DEVICE HAVING DOLMEN STRUCTURE AND METHOD FOR MANUFACTURING SAME

CROSS-REFERENCE TO RELATED APPLICATIONS

This application is a 35 U.S.C. § 371 national phase application of PCT/JP2019/017713, filed on Apr. 25, 2019.

TECHNICAL FIELD

The present disclosure relates to a semiconductor device having a dolmen structure including a substrate, a first chip disposed on the substrate, a plurality of support pieces disposed around the first chip, on the substrate, and a second chip supported by the plurality of support pieces and disposed to cover the first chip. In addition, the present disclosure relates to a manufacturing method for a semiconductor device having a dolmen structure. Note that, dolmen is a type of stone tomb, and includes a plurality of pillar stones, and a plate-shaped rock placed on the plurality of the pillar stones. In the semiconductor device having a dolmen structure, the support piece corresponds to the "pillar stone", and the second chip corresponds to the "plate-shaped rock".

BACKGROUND ART

Recently, in the field of a semiconductor device, high integration, downsizing, and speed-up have been required. As one aspect of the semiconductor device, a structure in which a semiconductor chip is laminated on a controller chip disposed on a substrate has attracted attention. For example, in Patent Literature 1, a semiconductor die assembly including a controller die, and a memory die supported by a support member on the controller die is disclosed. It can be said that a semiconductor assembly 100 illustrated in FIG. 1A of Patent Literature 1 has a dolmen structure. That is, the semiconductor assembly 100 includes a package substrate 102, a controller die 103 disposed on the surface of the package substrate 102, memory dies 106*a* and 106*b* disposed above the controller die 103, and support members 130*a* and 130*b* supporting the memory die 106*a*.

CITATION LIST

Patent Literature

Patent Literature 1: JP No. 2017-515306

SUMMARY OF INVENTION

Technical Problem

In Patent Literature 1, it is disclosed that as the support member (a support piece), a semiconductor material such as silicon can be used, and more specifically, a fraction of a semiconductor material that is obtained by dicing a semiconductor wafer can be used (refer to [0012], [0014], and FIG. 2 of Patent Literature 1). In order to manufacture a support piece for a dolmen structure by using a semiconductor wafer, as with the manufacturing of the general semiconductor chip, for example, each of the following steps is required:
(1) pasting a back grind tape to a semiconductor wafer;
(2) performing back grinding with respect to the semiconductor wafer;
(3) pasting a film including an adhesive layer and a bonding adhesive layer (a dicing die bonding-integrated film) to a dicing ring and the semiconductor wafer after the back grinding that is disposed in the dicing ring;
(4) peeling off the back grind tape from the semiconductor wafer;
(5) singulating the semiconductor wafer; and
(6) picking up a support piece including a laminated body of a semiconductor chip and a bonding adhesive piece from the adhesive layer.

The present disclosure provides a manufacturing method for a semiconductor device in which in a manufacturing process of a semiconductor device having a dolmen structure, a step of preparing a support piece can be simplified, and a semiconductor chip to be laminated can be stably supported. In addition, the present disclosure provides a semiconductor device having a dolmen structure.

Solution to Problem

One aspect of the present disclosure relates to a manufacturing method for a semiconductor device having a dolmen structure. Such a manufacturing method includes the following steps:
(A) preparing a laminate film including a base material film, an adhesive layer, and a support piece formation film including at least a thermosetting resin layer, in this order;
(B) forming support pieces on a surface of the adhesive layer by singulating the support piece formation film;
(C) picking up support piece from the adhesive layer;
(D) disposing a first chip on a substrate;
(E) disposing the plurality of support pieces around the first chip, on the substrate;
(F) preparing a bonding adhesive piece-attached chip including a second chip, and a bonding adhesive piece provided on one surface of the second chip; and
(G) constructing a dolmen structure by disposing the bonding adhesive piece-attached chip on surfaces of the plurality of support pieces.

In the manufacturing method according to the present disclosure, the support piece obtained by singulating the support piece formation film is used. Accordingly, the step of preparing the support piece can be simplified, compared to the manufacturing method of the related art in which the fraction of the semiconductor material that is obtained by dicing the semiconductor wafer is used as the support piece. That is, in the related art, the steps of (1) to (6) described above were required, whereas since the support piece formation film does not include a semiconductor wafer, the steps of (1), (2), and (4) relevant to the back grinding of the semiconductor wafer can be omitted. In addition, since the semiconductor wafer that is more expensive than a resin material is not used, the cost can also be reduced. Note that, since the thermosetting resin layer has adhesiveness with respect to other members (for example, the substrate), a bonding adhesive layer or the like may not be separately provided on the support piece.

In the support piece formation film described above, a shear strength of the support pieces (a cured product of the support piece formation film) and the bonding adhesive piece-attached chip at 250° C. after the support piece formation film is thermally compressed against the bonding adhesive piece of the bonding adhesive piece-attached chip and the support piece formation film is cured at 170° C. for 1 hour is 3.2 MPa or more. The support piece formed from such a support piece formation film tends to have high shear strength, compared to the support piece of the related art using the fraction of the semiconductor material that is obtained by dicing the semiconductor wafer. For example, it is considered that this is because both the support piece formation film and the bonding adhesive piece are cured products of resins. By using the support piece formed from such a support piece formation film, a semiconductor chip (the bonding adhesive piece-attached chip) to be laminated can be stably supported.

The adhesive layer of the laminate film that is prepared in the (A) step may be a pressure-sensitive or ultraviolet-curable adhesive layer. That is, the adhesive layer may or may not be cured by being irradiated with an ultraviolet ray, in other words, may or may not contain a resin having a photoreactive carbon-carbon double bond. Note that, the pressure-sensitive adhesive layer may contain the resin having a photoreactive carbon-carbon double bond. For example, a predetermined region of the adhesive layer may be irradiated with an ultraviolet ray to decrease the adhesiveness of the region, and for example, the resin having a photoreactive carbon-carbon double bond may remain. In a case where the adhesive layer is the ultraviolet-curable adhesive layer, the adhesiveness of the adhesive layer can be decreased by performing a step of irradiating the adhesive layer with an ultraviolet ray, between the (B) step and the (C) step.

The support piece formation film includes at least the thermosetting resin layer. A step of curing the thermosetting resin layer or the bonding adhesive piece by heating the support piece formation film or the support piece may be performed at a suitable timing, and for example, may be performed before the (G) step. In a stage where the bonding adhesive piece-attached chip is disposed to be in contact with the surface of the plurality of support pieces, the deformation of the support piece due to the disposition of the bonding adhesive piece-attached chip can be suppressed by curing in advance the thermosetting resin layer.

The support piece formation film may be any one of the following films:
  a film including a thermosetting resin layer;
  a three-layer film including a thermosetting resin layer, a resin layer having rigidity higher than that of the thermosetting resin layer, and a thermosetting resin layer; and
  a three-layer film including a thermosetting resin layer, a metal layer having rigidity higher than that of the thermosetting resin layer, and a thermosetting resin layer.

Note that, the rigidity of the thermosetting resin layer after thermal curing may be lower or higher than the rigidity of the resin layer or the metal layer. The rigidity indicates the ability of an object to endure breaking against bending or twisting.

One aspect of the present disclosure relates to a semiconductor device having a dolmen structure. That is, the semiconductor device includes a substrate, a first chip disposed on the substrate, a plurality of support pieces disposed around the first chip, on the substrate, and a bonding adhesive piece-attached chip supported by the plurality of support pieces and disposed to cover the first chip, in which the bonding adhesive piece-attached chip includes a second chip and a bonding adhesive piece provided on one surface of the second chip, and a shear strength of the support pieces and the bonding adhesive piece-attached chip at 250° C. is 3.2 MPa or more.

In a case where the shear strength of the support pieces and the bonding adhesive piece-attached chip at 250° C. is 3.2 MPa or more, the bonding adhesive piece-attached chip can be stably supported by the support piece, and connection reliability in the semiconductor device can be ensured for a long period of time.

The support piece may be any one of the followings:
  a support piece containing a cured product of a thermosetting resin composition;
  a support piece including a layer of a cured product of a thermosetting resin composition, a resin layer, and a layer of a cured product of a thermosetting resin composition; and
  a support piece including a layer of a cured product of a thermosetting resin composition, a metal layer, and a layer of a cured product of a thermosetting resin composition.

The semiconductor device according to the present disclosure described above includes the bonding adhesive piece that is provided on one surface of the second chip and is interposed between the second chip and the plurality of support pieces. In this case, the first chip may be separated from the bonding adhesive piece, or may be in contact with the bonding adhesive piece.

Advantageous Effects of Invention

According to the present disclosure, a manufacturing method for a semiconductor device is provided in which in a manufacturing process of a semiconductor device having a dolmen structure, a step of preparing a support piece can be simplified, and a semiconductor chip to be laminated can be stably supported. In addition, according to the present disclosure, a semiconductor device having a dolmen structure is provided.

DESCRIPTION OF EMBODIMENTS

Hereinafter, embodiments of the present disclosure will be described in detail, with reference to the drawings. However, the present invention is not limited to the following embodiments. Note that, herein, a "(meth)acrylic acid" indicates an acrylic acid or a methacrylic acid, and "(meth) acrylate" indicates acrylate or methacrylate corresponding thereto. "A or B" may include either A or B, or may include both of A and B.

Herein, the term of "layer" also includes a structure having a shape formed on the entire surface and a structure having a shape formed on a part of the surface when seen in the plan view. In addition, herein, the term of "step" includes not only an independent step, but also a step that is not clearly distinguishable from other steps insofar as a desired function of the step is attained. In addition, a numerical range represented by using "to" indicates a range including numerical values described before and after "to" as a minimum value and a maximum value, respectively.

Herein, in a case where there are a plurality of substances corresponding to each component in a composition, the content of each component in the composition indicates the total amount of the plurality of the substances in the composition, unless otherwise noted. In addition, exemplified materials may be used alone, or two or more types thereof may be used by being combined, unless otherwise noted. In addition, in numerical ranges described in stages herein, an upper limit value or a lower limit value of a numerical range in one stage may be replaced with an upper limit value or a lower limit value of a numerical range in another stage. In addition, in a numerical range described herein, an upper limit value or a lower limit value of the numerical range may be replaced with values described in Examples.

First Embodiment (Semiconductor Device)

Figure 1:
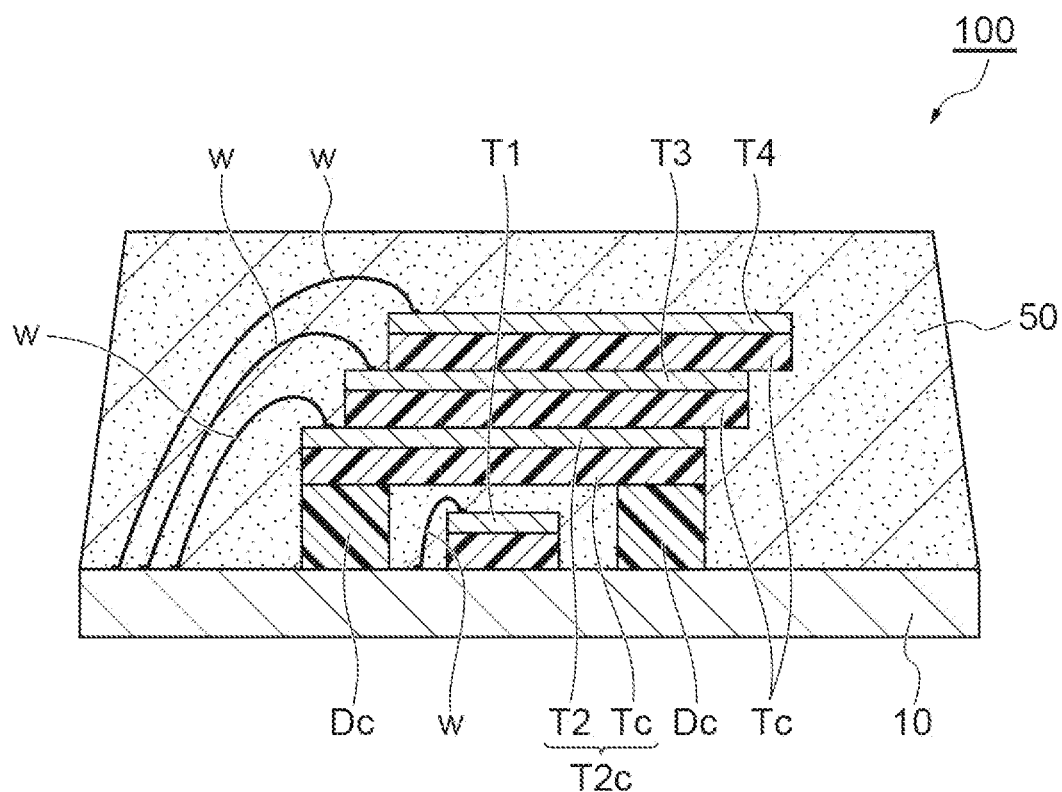
FIG. 1 is a sectional view schematically illustrating a first embodiment of a semiconductor device.

FIG. 1 is a sectional view schematically illustrating a first embodiment of a semiconductor device. A semiconductor device 100 illustrated in FIG. 1 includes a substrate 10, a chip T1 (a first chip) disposed on the surface of the substrate 10, a plurality of support pieces Dc disposed around the chip T1, on the surface of the substrate 10, a bonding adhesive piece-attached chip T2c disposed to be supported by the plurality of support pieces Dc and to cover the chip T1 (the first chip), chips T3 and T4 laminated on a chip T2, a plurality of wires w electrically connecting an electrode (not illustrated) on the surface of the substrate 10 and the chips T1 to T4, respectively, and a sealing material 50 filled in a gap between the chip T1 and the chip T2, or the like. The bonding adhesive piece-attached chip T2c includes a chip T2 (a second chip) and a bonding adhesive piece Tc provided on one surface of the chip T2 (the second chip).

In this embodiment, a dolmen structure is configured on the substrate 10 by the plurality of support pieces Dc and the bonding adhesive piece-attached chip T2c. The chip T1 is separated from the bonding adhesive piece Tc. By suitably setting the thickness of the support piece Dc, a space for the wire w connecting an upper surface of the chip T1 and the substrate 10 can be ensured.

The substrate 10 may be an organic substrate, or may be a metal substrate such as a lead frame. The thickness of substrate 10, for example, is 90 to 300 µm, and may be 90 to 210 µm, from the viewpoint of suppressing the warpage of the semiconductor device 100.

The chip T1, for example, is a controller chip, and is adhered to the substrate 10 by the bonding adhesive piece Tc and is electrically connected to the substrate 10 by the wire w. The shape of the chip T1 in the planar view, for example, is a quadrangular shape (a square shape or a rectangular shape). The length of one side of the chip T1, for example, is 5 mm or less, and may be 2 to 5 mm or 1 to 5 mm. The thickness of the chip T1, for example, is 10 to 150 µm, and may be 20 to 100 µm.

The chip T2, for example, is a memory chip, and is adhered onto the support piece Dc via the bonding adhesive piece Tc. The chip T2 has a size larger than that of the chip T1, in the planar view. The shape of the chip T2 in the planar view, for example, is a quadrangular shape (a square shape or a rectangular shape). The length of one side of the chip T2, for example, is 20 mm or less, and may be 4 to 20 mm or 4 to 12 mm. The thickness of the chip T2, for example, is 10 to 170 µm, and may be 20 to 120 µm. Note that, the chips T3 and T4, for example, are a memory chip, and are adhered onto the chip T2 via the bonding adhesive piece Tc. The length of one side of the chips T3 and T4 may be identical to that of the chip T2, and the thickness of the chips T3 and T4 may also be identical to that of the chip T2.

Figure 2:
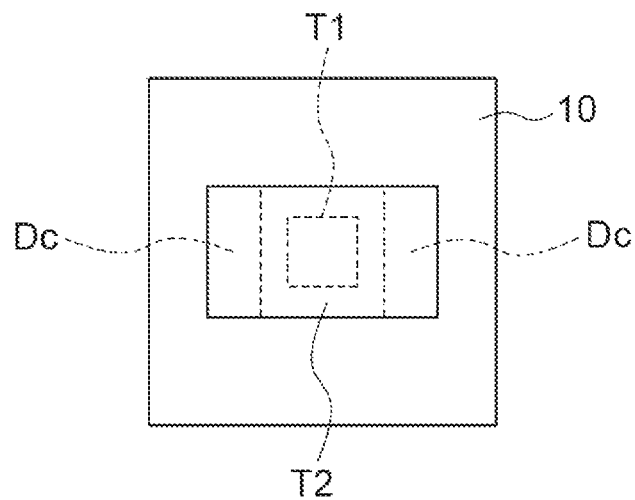
FIG. 2(a), FIG. 2(b), and FIG. 2(c) are plan views schematically illustrating an example of a positional relationship between a first chip and a plurality of support pieces.
Figure 2:
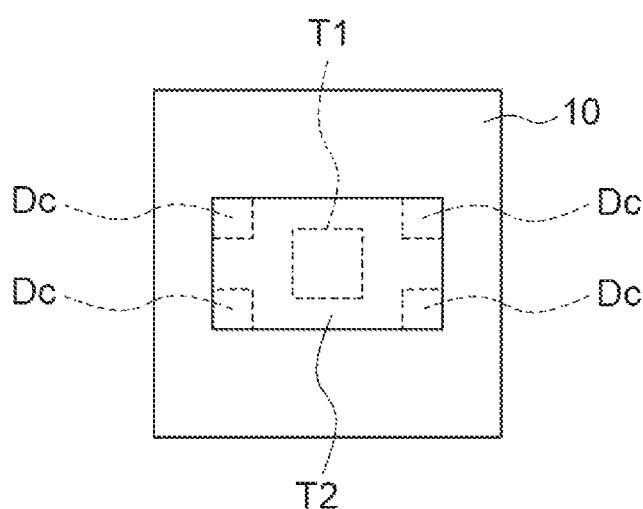
Figure 2:
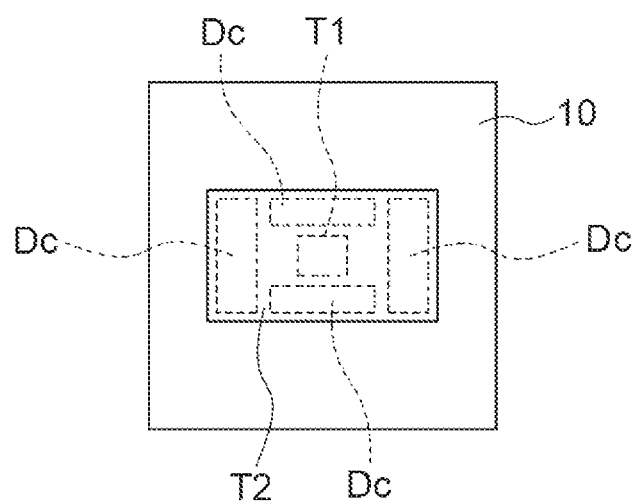

The support piece Dc serves in the role of a spacer for forming a space around the chip T1. The support piece Dc contains a cured product of a thermosetting resin composition (a cured product of a film including a thermosetting resin layer). Note that, as illustrated in FIG. 2(a), two support pieces Dc (Shape: a rectangular shape) may be disposed in separated positions on both sides of the chip T1, as illustrated in FIG. 2(b), one support piece Dc (Shape: a square shape, a total of 4) may be disposed in each position corresponding to the corner of the chip T1, or as illustrated in FIG. 2(c), one support piece Dc (Shape: a rectangular shape, a total of 4) may be disposed in each position corresponding to the side of the chip T1. The length of one side of the support piece Dc in the planar view, for example, is 20 mm or less, and may be 1 to 20 mm or 1 to 12 mm. The thickness (the height) of the support piece Dc, for example, is 10 to 180 and may be 20 to 120 µm.

A shear strength of the support pieces Dc and the bonding adhesive piece-attached chip T2c at 250° C. is 3.2 MPa or more, may be 3.3 MPa or more, may be 3.4 MPa or more, or may be 3.5 MPa or more. In a case where the shear strength of the support pieces Dc and the bonding adhesive piece-attached chip T2c at 250° C. is 3.2 MPa or more, the bonding adhesive piece-attached chip T2c can be stably supported by the support piece Dc, and connection reliability in the semiconductor device can be ensured for a long period of time. An upper limit of the shear strength of the support pieces Dc and the bonding adhesive piece-attached chip T2c at 250° C. is not particularly limited, and may be 10 MPa or less.

(Preparation Method for Support Piece)

An example of a preparation method for a support piece will be described. Note that, the support piece Dc illustrated in FIG. 1 is in a state after the thermosetting resin composition is cured. On the other hand, the support piece Da is in a state before the thermosetting resin composition is completely cured (for example, refer to FIG. 5(b)).

Figure 3:
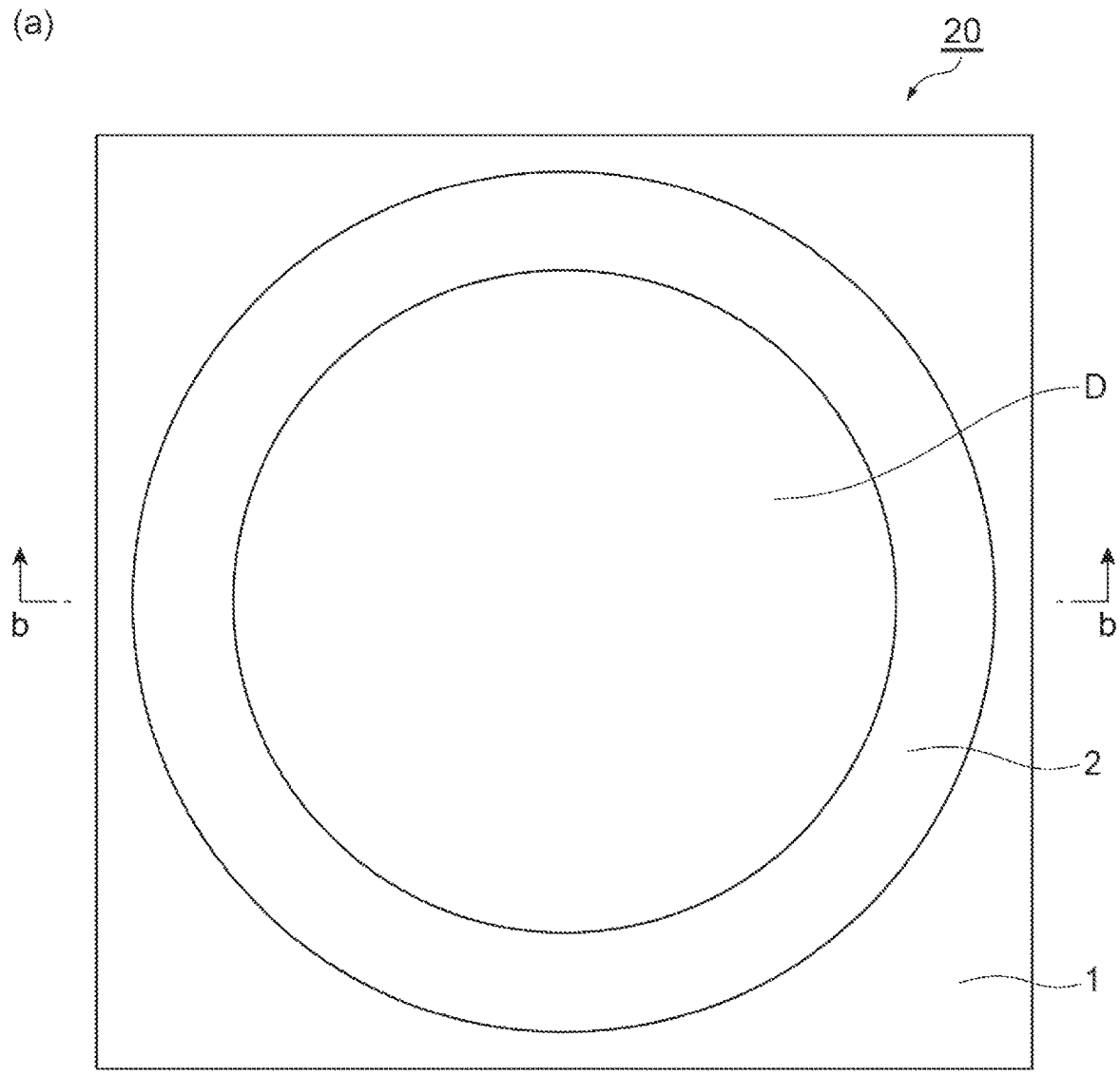
FIG. 3(a) is a plan view schematically illustrating one embodiment of a support piece formation laminate film.
FIG. 3(b) is a sectional view taken along line b-b of FIG. 3(a).
Figure 3:
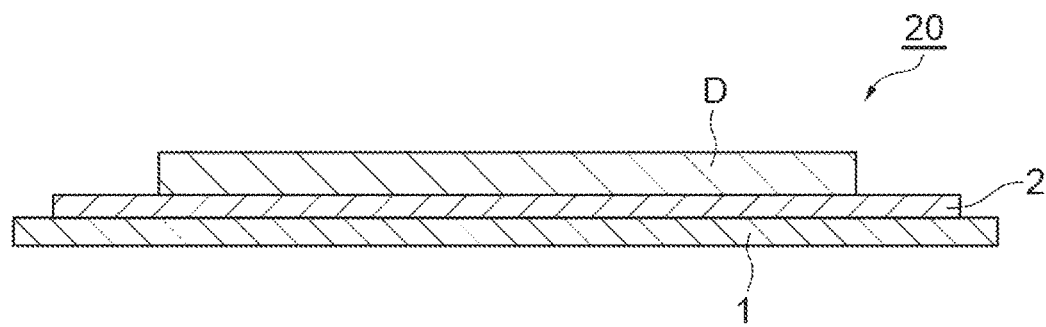

First, a support piece formation laminate film 20 (hereinafter, may be referred to as a "laminate film 20") illustrated in FIG. 3(a) and FIG. 3(b) is prepared. The laminate film 20 includes a base material film 1, an adhesive layer 2, and a support piece formation film D including at least a thermosetting resin layer. The base material film 1, for example, is a polyethylene terephthalate film (a PET film). The adhesive layer 2 is formed into a circular shape by punching or the like (refer to FIG. 3(a)). The adhesive layer 2 contains an ultraviolet-curable adhesive. That is, the adhesive layer 2 has properties of decreasing adhesiveness by being irradiated with an ultraviolet ray. The support piece formation film D is formed into a circular shape by punching or the like, and has a diameter smaller than that of the adhesive layer 2 (refer to FIG. 3(a)). The support piece formation film D includes a thermosetting resin layer 5 containing at least a thermosetting resin composition.

The thermosetting resin composition configuring the thermosetting resin layer 5 in the support piece formation film D can be in a semi-cured (a B-stage) state, and then, in a completely cured product (a C-stage) state by the subsequent curing treatment. The thermosetting resin composition may contain an epoxy resin, a curing agent, and an elastomer (for example, an acrylic resin), and as necessary, may further contain an inorganic filler, a curing accelerator, and the like, from the viewpoint of easily adjusting the shear strength of the support pieces and the bonding adhesive piece-attached chip at 250° C. in a predetermined range at the time of forming the support piece. The details of the thermosetting resin composition configuring the thermosetting resin layer 5 in the support piece formation film D will be described below.

The thickness of the support piece formation film D, for example, may be 5 to 180 μm or 20 to 120 μm. By setting the thickness of the support piece formation film to be in such a range, a dolmen structure having a suitable height with respect to the first chip (for example, the controller chip) can be constructed.

In the support piece formation film D, the shear strength of the support pieces Dc (a cured product of the support piece formation film D) and the bonding adhesive piece-attached chip T2c at 250° C. after the bonding adhesive piece Tc of the bonding adhesive piece-attached chip T2c is thermally compressed against the support piece formation film D and the support piece formation film D is cured at 170° C. for 1 hour is 3.2 MPa or more. The shear strength of the support pieces Dc (the cured product of the support piece formation film D) and the bonding adhesive piece-attached chip T2c at 250° C. may be 3.3 MPa or more, may be 3.4 MPa or more, or may be 3.5 MPa greater. By using support pieces formed from such a support piece formation film, the semiconductor chip (the bonding adhesive piece-attached chip) to be laminated can be stably supported. An upper limit of the shear strength of the support pieces Dc (the cured product of the support piece formation film D) and the bonding adhesive piece-attached chip T2c at 250° C. is not particularly limited, and for example, may be 10 MPa or less.

Figure 4:
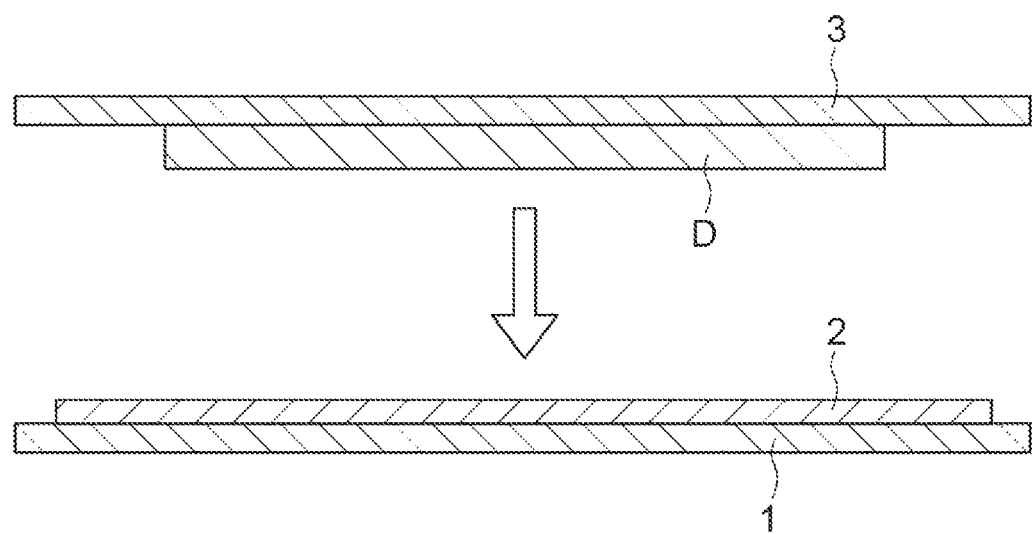
FIG. 4 is a sectional view schematically illustrating a step of bonding an adhesive layer and a support piece formation film.

The laminate film 20, for example, can be prepared by bonding a first laminate film including the base material film 1 and the adhesive layer 2 on the surface of the base material film 1, and a second laminate film including a cover film 3 and the support piece formation film D on the surface of the cover film 3 (refer to FIG. 4). The first laminate film is obtained through a step of forming the adhesive layer on the surface of the base material film 1 by coating, and a step of processing the adhesive layer into a predetermined shape (for example, a circular shape) by punching or the like. The second laminate film is obtained through a step of forming the support piece formation film on the surface of the cover film 3 (for example, a PET film or a polyethylene film) by coating, and a step of processing the support piece formation film into a predetermined shape (for example, a circular shape) by punching or the like. When the laminate film 20 is used, the cover film 3 is peeled off at a suitable timing.

Figure 5:
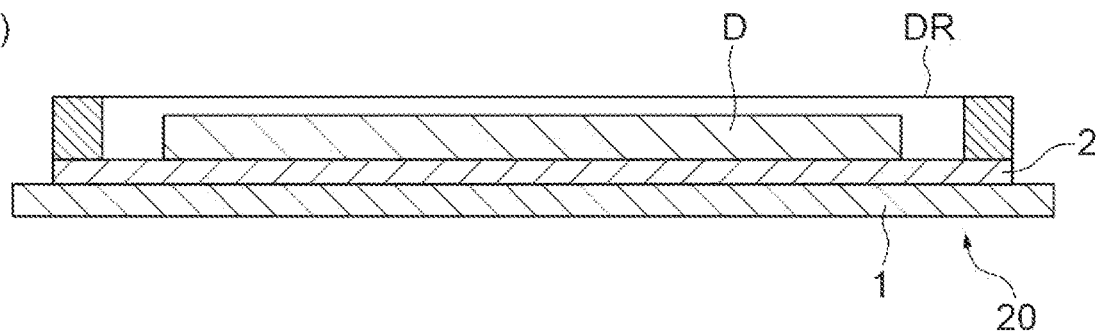
FIG. 5(a), FIG. 5(b), FIG. 5(c), and FIG. 5(d) are sectional views schematically illustrating a preparation procedure of a support piece.
Figure 5:
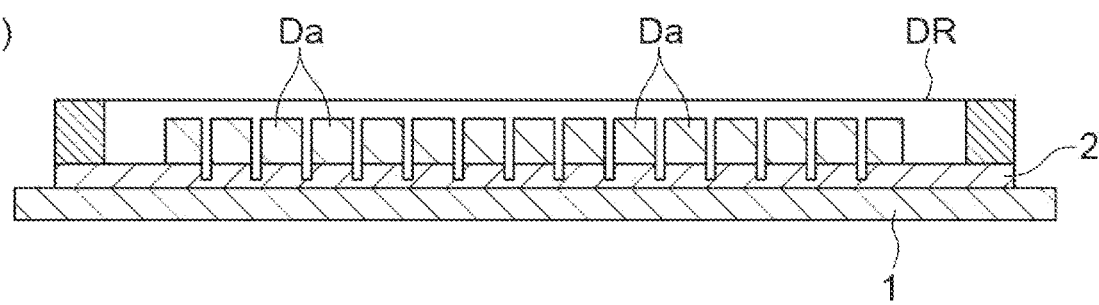
Figure 5:
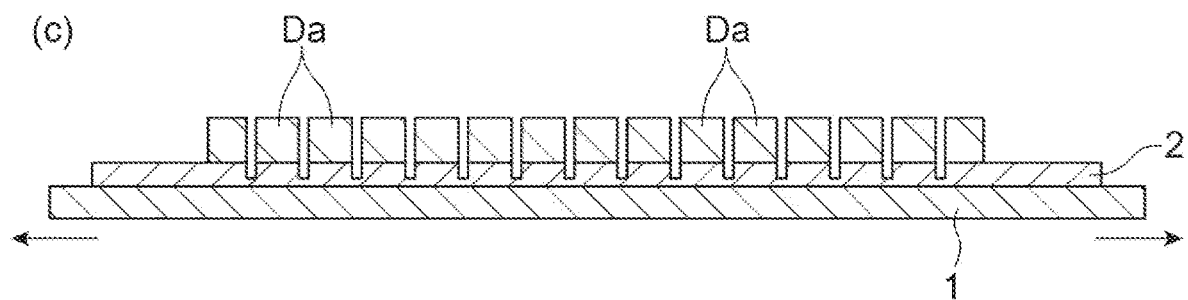
Figure 5:
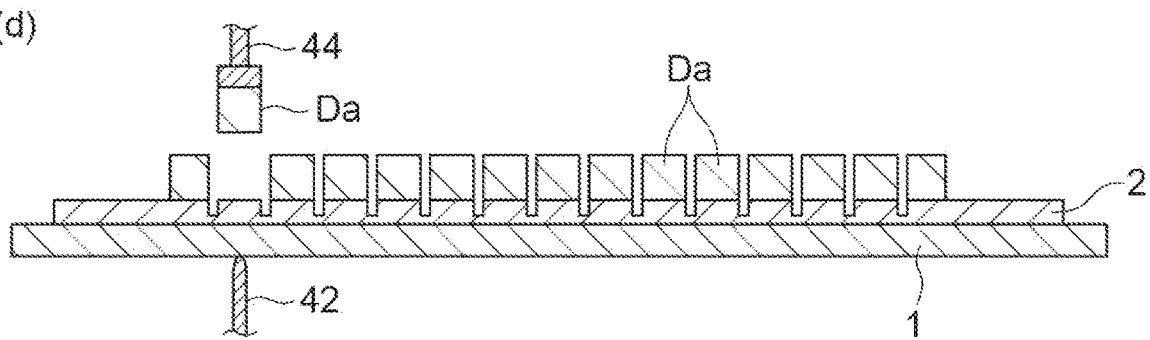

As illustrated in FIG. 5(a), a dicing ring DR is pasted to the laminate film 20. That is, the dicing ring DR is pasted to the adhesive layer 2 of the laminate film 20 such that the support piece formation film D is disposed inside the dicing ring DR. The support piece formation film D is singulated by dicing (refer to FIG. 5(b)). Accordingly, a plurality of support pieces Da are obtained from the support piece formation film D. After that, the adhesive layer 2 is irradiated with an ultraviolet ray to decrease an adhesive force between the adhesive layer 2 and the support piece Da. After the irradiation with an ultraviolet ray, as illustrated in FIG. 5(c), the support pieces Da are separated from each other by the expansion of the base material film 1. As illustrated in FIG. 5(d), the support piece Da is thrust up by a thrust-up jig 42 such that the support piece Da is peeled off from the adhesive layer 2 and the support piece Da is picked up by being sucked with a suction collet 44. Note that, a curing reaction of a thermosetting resin may be advanced by heating the support piece formation film D before dicing or the support piece Da before pickup. Since the support piece Da is suitably cured at the time of being picked up, excellent pickup properties can be attained.

(Manufacturing Method for Semiconductor Device)

A manufacturing method for the semiconductor device 100 will be described. A manufacturing method according to this embodiment includes the following (A) to (H) steps:

(A) preparing the laminate film 20 (refer to FIG. 4);
(B) forming support pieces Da on the surface of the adhesive layer 2 by singulating the support piece formation film D (refer to FIG. 5(b));
(C) picking up the support piece Da from the adhesive layer 2 (refer to FIG. 5(d));
(D) disposing the first chip T1 on the substrate 10;
(E) disposing the plurality of support pieces Da around the first chip T1, on the substrate 10 (refer to FIG. 6);
(F) preparing a bonding adhesive piece-attached chip T2a including a second chip T2, and a bonding adhesive piece Ta provided on one surface of the second chip T2 (refer to FIG. 7);
(G) constructing a dolmen structure 60 by disposing the bonding adhesive piece-attached chip T2a on the surfaces of the plurality of support pieces Dc (refer to FIG. 8); and
(H) sealing the gap between the chip T1 and the chip T2, or the like, with the sealing material 50 (refer to FIG. 1).

The (A) to (C) steps are a process for preparing support pieces Da, which have already been described. The (D) to (H) steps are a process for constructing the dolmen structure on the substrate 10 by using the plurality of support pieces Da. Hereinafter, the (D) to (H) steps will be described with reference to FIGS. 6 to 8.

[(D) Step]

The (D) step is a step of disposing the first chip T1 on the substrate 10. For example, first, the chip T1 is disposed in a predetermined position on the substrate 10 via a bonding adhesive layer T1c. After that, the chip T1 is electrically connected to the substrate 10 by the wire w.

[(E) Step]

Figure 6:
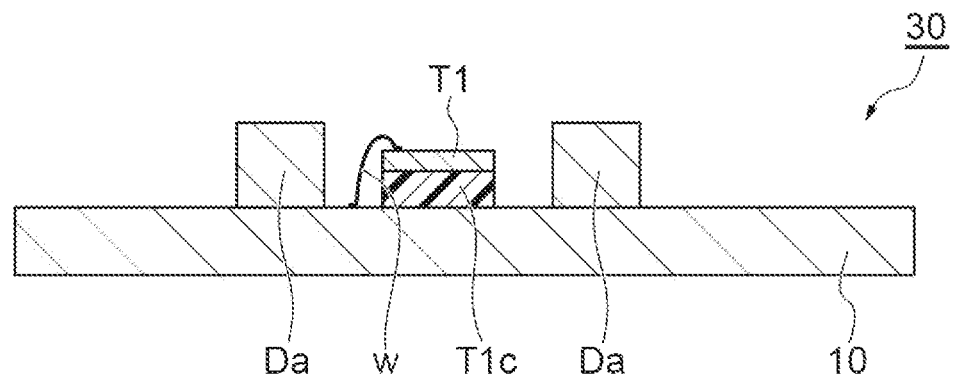
FIG. 6 is a sectional view schematically illustrating a state in which a plurality of support pieces are disposed around a first chip, on a substrate.

The (E) step is a step of disposing the plurality of support pieces Da around the first chip T1, on the substrate 10. Through this step, a structural body 30 illustrated in FIG. 6 is prepared. The structural body 30 includes the substrate 10, and the chip T1 and the plurality of support pieces Da disposed on the surface of the substrate 10. The support piece Da may be disposed by a compression treatment. It is preferable that the compression treatment, for example, is performed in a condition of 80 to 180° C. and 0.01 to 0.50 MPa, for 0.5 to 3.0 seconds. Note that, the support piece Da may become the support piece Dc by being completely cured at a time point of the (E) step, or may not be completely cured at the time point. It is preferable that the support piece Da becomes the support piece Dc by being completely cured at a time point before the (G) step starts.

[(F) Step]

Figure 7:
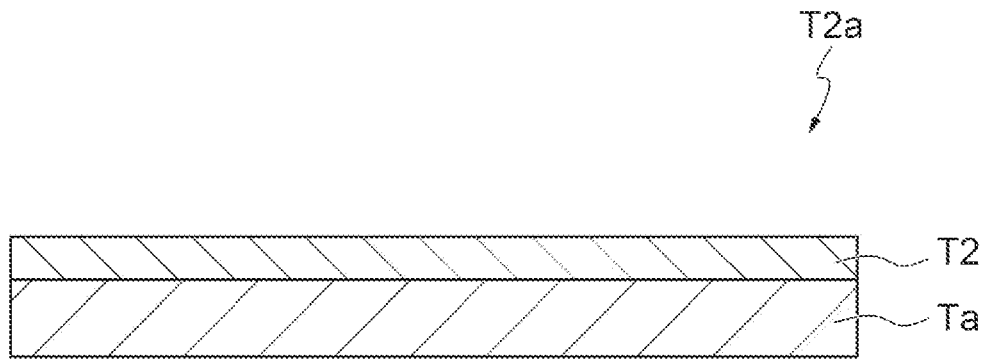
FIG. 7 is a sectional view schematically illustrating an example of a bonding adhesive piece-attached chip.
Figure 8:
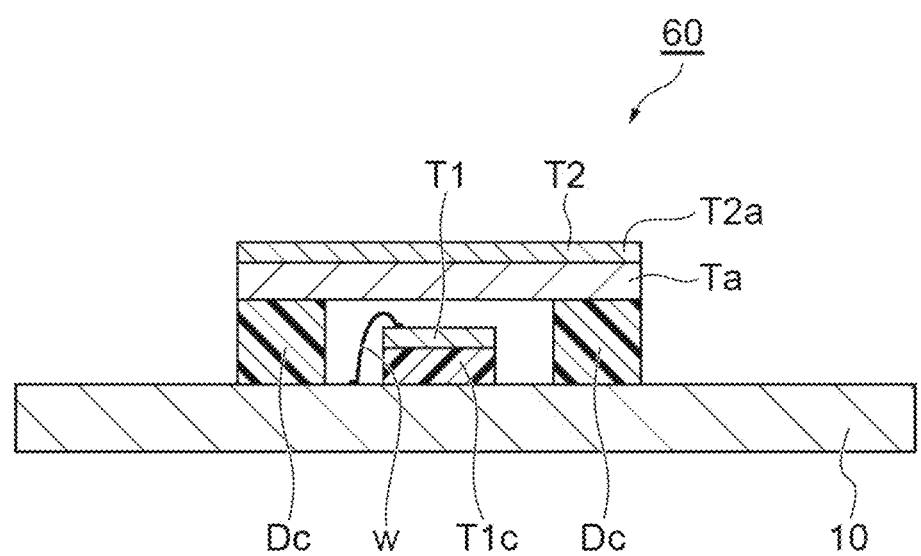
FIG. 8 is a sectional view schematically illustrating a dolmen structure formed on a substrate.

The (F) step is a step of preparing the bonding adhesive piece-attached chip T2a illustrated in FIG. 7. The bonding adhesive piece-attached chip T2a includes the chip T2, and the bonding adhesive piece Ta provided on one surface of the chip T2. The bonding adhesive piece-attached chip T2a, for example, can be obtained by using a semiconductor wafer and a dicing die bonding-integrated film through a dicing step and a pickup step.

[(G) Step]

The (G) step is a step of disposing the bonding adhesive piece-attached chip T2a above the chip T1 such that the bonding adhesive piece Ta is in contact with the upper surfaces of the plurality of support pieces Dc. Specifically, the chip T2 is compressed against the upper surface of the support piece Dc via the bonding adhesive piece Ta. It is preferable that such a compression treatment, for example, is performed in a condition of 80 to 180° C. and 0.01 to 0.50 MPa, for 0.5 to 3.0 seconds. Next, the bonding adhesive piece Ta is cured by heating. It is preferable that such a curing treatment, for example, is performed in a condition of 60 to 175° C. and 0.01 to 1.0 MPa, for 5 minutes or more. Accordingly, the bonding adhesive piece Ta is cured to be the bonding adhesive piece Tc. Through this step, the dolmen structure 60 is constructed on the substrate 10 (refer to FIG. 8).

The chip T3 is disposed on the chip T2 via a bonding adhesive piece, and the chip T4 is disposed on the chip T3 via a bonding adhesive piece, before the (H) step and after the (G) step. The bonding adhesive piece may contain the same thermosetting resin composition as that of the bonding adhesive piece Ta described above, and becomes the bonding adhesive piece Tc by heating and curing (refer to FIG. 1). On the other hand, each of the chips T2, T3, and T4 is electrically connected to the substrate 10 by the wire w. Note that, the number of chips to be laminated above the chip T1 is not limited to 3 described in this embodiment, and may be suitably set.

[(H) Step]

The (H) step is a step of sealing the gap between the chip T1 and the chip T2, or the like, with the sealing material 50. Through this step, the semiconductor device 100 illustrated in FIG. 1 is completed.

(Thermosetting Resin Composition Configuring Thermosetting Resin Layer)

The support piece formation film D includes at least the thermosetting resin layer 5. As described above, the thermosetting resin composition configuring the thermosetting resin layer 5 in the support piece formation film D may contain the epoxy resin, the curing agent, and the elastomer, and as necessary, may further contain the inorganic filler, the curing accelerator, and the like, from the viewpoint of easily adjusting the shear strength of the support pieces and the bonding adhesive piece-attached chip at 250° C. in a pre-determined range at the time of forming the support piece. According to the studies of the present inventors, it is preferable that the support piece Da and the support piece Dc after curing have the following properties:

Property 1: adhesion strength between the bonding adhesive piece-attached chip T2c and the bonding adhesive piece Tc is sufficiently high;

Property 2: when the support piece Da is thermally compressed in a predetermined position of the substrate 10, a position shift is less likely to occur (a melt viscosity (a shear viscosity) of a bonding adhesive piece 5p at 120° C., for example, is 4300 to 50000 Pa·s or 5000 to 40000 Pa·s);

Property 3: a bonding adhesive piece 5c in the semiconductor device 100 exhibits stress relieving properties (the thermosetting resin composition contains the elastomer (a rubber component));

Property 4: a contraction rate associated with curing is sufficiently small;

Property 5: the visibility of the support piece Da by a camera is excellent in the pickup step (the thermosetting resin composition, for example, contains a colorant); and Property 6: the bonding adhesive piece 5c has sufficient mechanical strength.

[Epoxy Resin]

The epoxy resin is not particularly limited insofar as having an adhesion function by curing. A difunctional epoxy resin such as a bisphenol A type epoxy resin, a bisphenol F type epoxy resin, and a bisphenol S type epoxy resin, a novolac type epoxy resin such as a phenol novolac type epoxy resin and a cresol novolac type epoxy resin, and the like can be used. In addition, generally known epoxy resins such as a polyfunctional epoxy resin, a glycidyl amine type epoxy resin, a heterocyclic ring-containing epoxy resin, and an alicyclic epoxy resin can be applied. One type of the epoxy resins may be used alone, or two or more types thereof may be used together.

[Curing Agent]

Examples of the curing agent include a phenolic resin, an ester compound, aromatic amine, aliphatic amine, an acid anhydride, and the like. Among them, the phenolic resin is preferable from the viewpoint of attaining high shear strength (die shear strength). Examples of a commercially available product of the phenolic resin include LF-4871 (Product Name, a BPA novolac type phenolic resin), manufactured by DIC Corporation, HE-100C-30 (Product Name, a phenyl aralkyl type phenolic resin), manufactured by AIR WATER INC., PHENOLITE KA and TD series, manufactured by DIC Corporation, Milex XLC-series and XL series (for example, Milex XLC-LL), manufactured by Mitsui Chemicals, Inc., HE series (for example, HE100C-30), manufactured by AIR WATER INC., MEHC-7800 series (for example, MEHC-7800-4S), manufactured by MEIWA PLASTIC INDUSTRIES, LTD., JDPP series, manufactured by JFE Chemical Corporation, PSM series (for example, PSM-4326), manufactured by Gunei Chemical Industry Co., Ltd., and the like. One type of the curing agents may be used alone, or two or more types thereof may be used together.

In a compounding amount of the epoxy resin and the phenolic resin, an equivalent ratio of an epoxy equivalent and a hydroxyl group equivalent is preferably 0.6 to 1.5, is more preferably 0.7 to 1.4, and is even more preferably 0.8 to 1.3, from the viewpoint of attaining high shear strength (die shear strength). By setting a compounding ratio to be in the range described above, both of curing properties and fluidity are easily attained to a sufficiently high level.

[Elastomer]

Examples of the elastomer include an acrylic resin, a polyester resin, a polyamide resin, a polyimide resin, a silicone resin, polybutadiene, acrylonitrile, epoxy-modified polybutadiene, maleic anhydride-modified polybutadiene, phenol-modified polybutadiene, carboxy-modified acrylonitrile, and the like.

As the elastomer, an acrylic resin is preferable, and an acrylic resin such as an epoxy group-containing (meth) acrylic copolymer obtained by polymerizing a functional monomer having an epoxy group or a glycidyl group as a cross-linkable functional group, such as glycidyl acrylate or glycidyl methacrylate, is more preferable, from the viewpoint of attaining high shear strength (die shear strength). Among the acrylic resins, an epoxy group-containing (meth) acrylic acid ester copolymer and epoxy group-containing acrylic rubber are preferable, and the epoxy group-containing acrylic rubber is more preferable. The epoxy group-containing acrylic rubber is rubber having an epoxy group that contains acrylic acid ester as a main component and mainly contains a copolymer such as butyl acrylate and acrylonitrile, and a copolymer such as ethyl acrylate and acrylonitrile, and the like. Note that, the acrylic resin may have not only the epoxy group but also a cross-linkable functional group such as alcoholic or phenolic hydroxyl group and carboxyl group.

Examples of a commercially available product of the acrylic resin include SG-70L, SG-708-6, WS-023 EK30, SG-280 EK23, and a SG-P3 solvent-changed product (Product Name, acrylic rubber, Weight Average Molecular Weight: 800000, Tg: 12° C., Solvent: cyclohexanone), manufactured by Nagase ChemteX Corporation, and the like.

A glass transition temperature (Tg) of the acrylic resin is preferably −50 to 50° C., and is more preferably −30 to 30° C., from the viewpoint of attaining high shear strength (die shear strength). A weight average molecular weight (Mw) of the acrylic resin is preferably 100000 to 3000000, and is more preferably 500000 to 2000000, from the viewpoint of attaining high shear strength (die shear strength). Here, Mw indicates a value that is measured by gel permeation chromatography (GPC) and is converted by using a calibration curve of standard polystyrene. Note that, there is a tendency that a highly elastic bonding adhesive piece can be formed by using the acrylic resin having a narrow molecular weight distribution.

The amount of acrylic resin contained in the thermosetting resin composition is preferably 10 to 200 parts by mass, and is more preferably 20 to 100 parts by mass, with respect to the total of 100 parts by mass of the epoxy resin and an epoxy resin curing agent, from the viewpoint of attaining high shear strength (die shear strength).

[Inorganic Filler]

Examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, amorphous silica, and the like. One type of the inorganic fillers may be used alone, or two or more types thereof may be used together.

An average particle diameter of the inorganic filler is preferably 0.005 µm to 1.0 µm, and is more preferably 0.05 to 0.5 µm, from the viewpoint of attaining high shear strength (die shear strength). It is preferable that the surface of the inorganic filler is chemically modified, from the viewpoint of attaining high shear strength (die shear strength). Examples of a material for chemically modifying the surface include a silane coupling agent and the like. Examples of the type of functional group of the silane coupling agent include a vinyl group, an acryloyl group, an epoxy group, a mercapto group, an amino group, a diamino group, an alkoxy group, an ethoxy group, and the like.

The content of the inorganic filler is preferably 20 to 200 parts by mass, and is more preferably 30 to 100 parts by mass, with respect to 100 parts by mass of resin components of the thermosetting resin composition, from the viewpoint of attaining high shear strength (die shear strength).

[Curing Accelerator]

Examples of the curing accelerator include imidazoles and derivatives thereof, an organic phosphorus-based compound, secondary amines, tertiary amines, a quaternary ammonium salt, and the like. An imidazole-based compound is preferable from the viewpoint of attaining high shear strength (die shear strength). Examples of the imidazoles include 2-methyl imidazole, 1-benzyl-2-methyl imidazole, 1-cyanoethyl-2-phenyl imidazole, 1-cyanoethyl-2-methyl imidazole, and the like. One type of the curing accelerators may be used alone, or two or more types thereof may be used together.

The content of the curing accelerator in the thermosetting resin composition is preferably 0.04 to 3 parts by mass, and is more preferably 0.04 to 0.2 parts by mass, with respect to the total of 100 parts by mass of the epoxy resin and the epoxy resin curing agent, from the viewpoint of attaining high shear strength (die shear strength).

Second Embodiment

Figure 9:
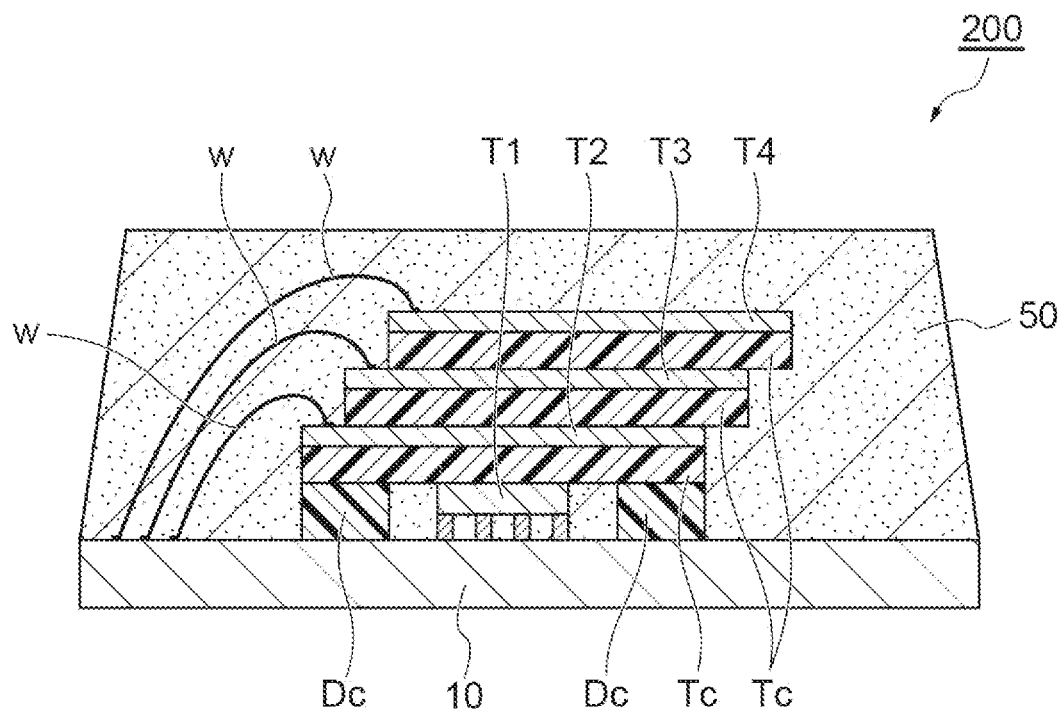
FIG. 9 is a sectional view schematically illustrating a second embodiment of the semiconductor device.

FIG. 9 is a sectional view schematically illustrating a second embodiment of the semiconductor device. In the semiconductor device 100 according to the first embodiment, the chip T1 is separated from the bonding adhesive piece Tc, whereas in a semiconductor device 200 according to this embodiment, the chip T1 is in contact with the bonding adhesive piece Tc. That is, the bonding adhesive piece Tc is in contact with the upper surface of the chip T1 and the upper surface of the support piece Dc. For example, the position of the upper surface of the chip T1 can be coincident with the position of the upper surface of the support piece Dc by suitably setting the thickness of the support piece formation film D.

In the semiconductor device 200, the chip T1 is connected to the substrate 10 by flip chip connection but not wire bonding. Note that, even in a case where the chip T1 is connected to the substrate 10 by the wire bonding, the chip T1 can be in contact with the bonding adhesive piece Tc insofar as the wire w is embedded in the bonding adhesive piece Ta configuring the bonding adhesive piece-attached chip T2a together with the chip T2.

Figure 10:
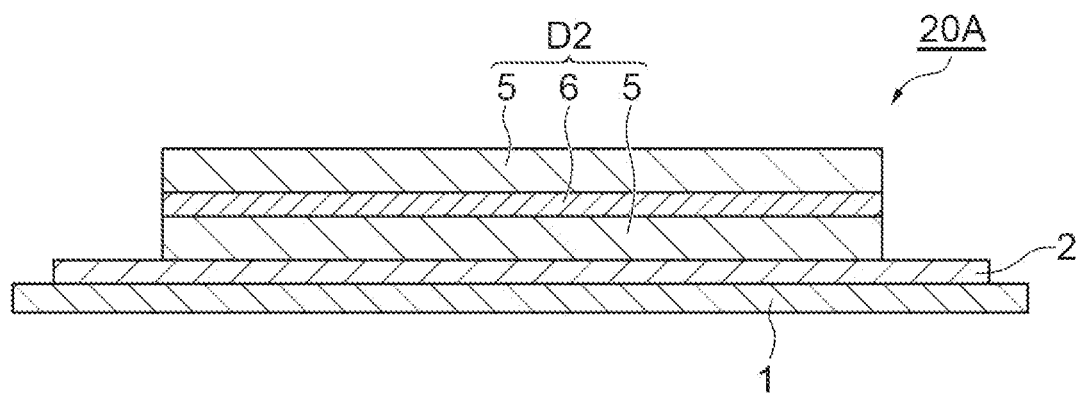
FIG. 10 is a sectional view schematically illustrating another embodiment of the support piece formation laminate film.

In the embodiments described above, as illustrated in FIG. 3(b), the support piece formation laminate film 20 including the support piece formation film D having a single-layer structure has been exemplified, but the support piece formation laminate film may have a three-layer structure. A support piece formation laminate film 20A illustrated in FIG. 10 includes a three-layer film D2 (a support piece formation film) including the thermosetting resin layer 5, a resin layer 6 or a metal layer having rigidity higher than that of the thermosetting resin layer, and the thermosetting resin layer 5, in this order.

The support piece formation laminate film 20A, for example, can be manufactured through the following steps:
  preparing a laminate film including the base material film 1, the adhesive layer 2, and the thermosetting resin layer 5, in this order;

bonding the resin layer 6 or the metal layer having rigidity higher than that of the thermosetting resin layer 5 to the surface of the laminate film described above; and bonding the thermosetting resin layer 5 to the surface of the resin layer 6 or the metal layer.

EXAMPLES

Hereinafter, the present disclosure will be described by Examples, but the present invention is not limited to these Examples.

[Preparation of Support Piece Formation Film]

<Preparation of Varnish>

Materials shown in Table 1 were used at compositional ratios (Unit:parts by mass) shown in Table 1. Cyclohexanone was added to an epoxy resin, a phenolic resin, and an inorganic filler, and was stirred and mixed. The content of the cyclohexanone was adjusted such that a solid content ratio was 40 mass % in a varnish to be finally obtained. An elastomer was added thereto, a coupling agent and a curing accelerator were further added, and stirring was performed until each component was homogeneous to prepare varnishes A to C.

The details of each component shown in Table 1 are as follows:

Epoxy Resin: YDCN-700-10 (Product Name, manufactured by Nippon Steel & Sumikin Chemical Co., Ltd., an o-cresol novolac type epoxy resin, Epoxy Equivalent: 209 g/eq);

Phenolic Resin (Curing Agent): HE-100C-30 (Product Name, manufactured by AIR WATER INC., a phenol aralkyl type phenolic resin, Hydroxyl Group Equivalent: 170 g/eq);

Phenolic Resin (Curing Agent): PSM-4326 (Product Name, manufactured by Gunei Chemical Industry Co., Ltd., a phenol novolac type phenolic resin, Hydroxyl Group Equivalent: 105 g/eq);

Inorganic Filler: AEROSIL R972 (Product Name, manufactured by NIPPON AEROSIL CO., LTD., silica, an average particle diameter of 0.016 µm);

Inorganic Filler: SC2050-HLG (Product Name, manufactured by Admatechs Company Limited, a silica filler dispersion liquid, an average particle diameter of 0.50 µm);

Elastomer: a SG-P3 solvent-changed product (Product Name, manufactured by Nagase ChemteX Corporation, acrylic rubber, Weight Average Molecular Weight: 800000, Tg: 12° C., Solvent: cyclohexanone);

Coupling Agent: A-189 (Product Name, manufactured by GE Toshiba Silicones Co., Ltd., γ-mercaptopropyl trimethoxy silane);

Coupling Agent: A-1160 (Product Name, manufactured by GE Toshiba Silicones Co., Ltd., γ-ureidopropyl triethoxy silane); and Curing Accelerator: CUREZOL 2PZ—CN (Product Name, manufactured by SHIKOKU CHEMICALS CORPORATION, 1-cyanoethyl-2-phenyl imidazole).

TABLE 1

| Material | | Varnish A | Varnish B | Varnish C |
|---|---|---|---|---|
| Epoxy resin | YDCN-700-10 | 13.5 | 11.4 | 14.4 |
| Phenolic resin | HE-100C-30 | 11.0 | 9.0 | — |
|  | PSM-4326 | — | — | 6.0 |
| Inorganic filler | R972 | 8.0 | 8.0 | — |

TABLE 1-continued

| Material | | Varnish A | Varnish B | Varnish C |
|---|---|---|---|---|
|  | SC2050-HLG | — | — | 8.0 |
| Elastomer | SG-P3 | 66.0 | 70.0 | 70.0 |
| Coupling agent | A-189 | 0.4 | 0.4 | 0.4 |
|  | A-1160 | 1.15 | 1.23 | 1.23 |
| Curing accelerator | 2PZ-CN | 0.03 | 0.05 | 0.04 |

<Preparation of Support Piece Formation Film>

Manufacturing Example 1

The varnish A was filtered with a 100-mesh filter and was vacuum-defoamed. As a base material film, a polyethylene terephthalate (PET) film having a thickness of 38 µm that had been subjected to a mold release treatment was prepared, and the varnish A after being vacuum-defoamed was applied onto the PET film. The applied varnish A was heated and dried in two stages at 90° C. for 5 minutes, and then, at 130° C. for 5 minutes to obtain a support piece formation film of Manufacturing Example 1 in a B-stage state. A coating amount of the varnish A was adjusted such that the thickness was 50 µm.

Manufacturing Example 2

A support piece formation film of Manufacturing Example 2 was obtained as with Manufacturing Example 1, except that the varnish A was changed to the varnish B.

Manufacturing Example 3

A support piece formation film of Manufacturing Example 3 was obtained as with Manufacturing Example 1, except that the varnish A was changed to the varnish C.

[Measurement of Shear Strength]

<Preparation of Bonding Adhesive Piece-Attached Chip>

A dicing die bonding-integrated adhesive film including a film-shaped bonding adhesive and an adhesive film (Film-Shaped Bonding Adhesive: a thickness of 50 µm, Adhesive Film: a thickness of 110 µm, manufactured by Hitachi Chemical Co., Ltd.) and a silicon wafer having a thickness of 400 µm were prepared. The silicon wafer was laminated on the film-shaped bonding adhesive of the dicing die bonding-integrated adhesive film at a stage temperature of 70° C. to prepare a dicing sample.

The obtained dicing sample was cut by using a fully automatic dicer DFD-6361 (manufactured by DISCO CORPORATION). The cutting was performed by a step cut method using two blades, and dicing blades ZH05-SD3500-N1-xx-DD and ZH05-SD4000-N1-xx-BB (both are manufactured by DISCO CORPORATION) were used. A cutting conditions were a number of blade rotations of 4000 rpm, a cutting rate of 50 mm/second, and a chip size of 5 mm×5 mm. In the cutting, the first cutting was performed such that the silicon wafer of approximately 200 µm remained, and then, the second cutting was performed such that a cutout of approximately 20 µm was formed in the adhesive film. Next, a chip was picked up by using a pickup collet to obtain a bonding adhesive piece-attached chip.

<Preparation of Evaluation Sample>

Example 1

A solder resist substrate (manufactured by TAIYO HOLDINGS CO., LTD., Product Name: AUS-308) and the support piece formation film of Manufacturing Example 1 were prepared, and the solder resist substrate was laminated on the support piece formation film of Manufacturing Example 1 at a stage temperature of 70° C. Next, the bonding adhesive piece-attached chip that was prepared as described above was prepared, and the bonding adhesive piece side of the bonding adhesive piece-attached chip was disposed on the support piece formation film of Manufacturing Example 1, and was thermally compressed. A thermal compression condition was a temperature of 120° C., a time of 1 second, and a pressure of 0.1 MPa. Subsequently, a sample obtained by thermal compression was put in a drying machine, and was cured at 170° C. for 1 hour to prepare an evaluation sample of Example 1.

Example 2

An evaluation sample of Example 2 was prepared as with Example 1, except that the support piece formation film of Manufacturing Example 1 was changed to the support piece formation film of Manufacturing Example 2.

Example 3

An evaluation sample of Example 3 was prepared as with Example 1, except that the support piece formation film of Manufacturing Example 1 was changed to the support piece formation film of Manufacturing Example 3.

Comparative Example 1

A solder resist substrate (manufactured by TAIYO HOLDINGS CO., LTD., Product Name: AUS-308) and a silicon wafer with a bonding adhesive layer were prepared, and the solder resist substrate was laminated on the bonding adhesive layer of the silicon wafer with a bonding adhesive layer at a stage temperature of 70° C. Next, the bonding adhesive piece-attached chip prepared as described above was prepared, and the bonding adhesive piece side of the bonding adhesive piece-attached chip was disposed on the silicon wafer, and was thermally compressed. A thermal compression condition was a temperature of 120° C., a time of 1 second, and a pressure of 0.1 MPa. Subsequently, a sample obtained by thermal compression was put in a drying machine, and was cured at 170° C. for 1 hour to prepare an evaluation sample of Comparative Example 1.
<Measurement of Shear Strength>

Shear strength was measured by using each of the evaluation samples of Examples 1 to 3 and Comparative Example 1. By hooking and pulling the chip of the bonding adhesive piece-attached chip in the evaluation sample, the shear strength of the support pieces and the bonding adhesive piece-attached chip at 250° C. was measured by using a universal bond tester (manufactured by Nordson Advanced Technology K. K.). Results are shown in Table 2.

TABLE 2

|  | Exam. 1 | Exam. 2 | Exam. 3 | Comp. Exam. 1 |
|---|---|---|---|---|
| Type of support piece | Manu. Exam. 1 | Manu. Exam. 2 | Manu. Exam. 3 | Silicon wafer |
| Shear strength (230° C., MPa) | 3.6 | 3.8 | 3.5 | 3.0 |

As shown in Table 2, the evaluation samples of Examples 1 to 3 were excellent in the shear strength, compared to the evaluation sample of Comparative Example 1. From this, it was suggested that a semiconductor bonding adhesive piece-attached chip to be laminated on the support piece was excellent in support stability.

INDUSTRIAL APPLICABILITY

According to the present disclosure, a manufacturing method for a semiconductor device is provided in which in a manufacturing process of a semiconductor device having a dolmen structure, a step of preparing a support piece can be simplified, and a semiconductor chip to be laminated can be stably supported. In addition, according to the present disclosure, a semiconductor device having a dolmen structure is provided.

REFERENCE SIGNS LIST

1: base material film, 2: adhesive layer, 5: thermosetting resin layer, 6: resin layer, 10: substrate, 20, 20A: support piece formation laminate film, 50: sealing material, 60: dolmen structure, 100, 200: semiconductor device, D: support piece formation film, D2: three-layer film (support piece formation film), Da: support piece, Dc: support piece (cured product), T1: first chip, T2: second chip, T2a: bonding adhesive piece-attached chip, T2c: bonding adhesive piece-attached chip (cured product), Ta: bonding adhesive piece, Tc: bonding adhesive piece (cured product).

The invention claimed is:

1. A manufacturing method for a semiconductor device having a dolmen structure, wherein the dolmen structure includes a substrate, a first chip disposed on the substrate, a plurality of support pieces disposed around the first chip on the substrate, and a bonding adhesive piece-attached chip, including a second chip and a bonding adhesive piece attached on one surface of the second chip, supported by the support pieces and disposed to cover the first chip, the method comprising:
   providing a laminate film including an adhesive layer laminated between a base material film and a support piece formation film, the support piece formation film consisting of a thermosetting resin layer;
   forming the support pieces configurated to support the bonding adhesive piece-attached chip, on a surface of the adhesive layer by dicing the support piece formation film of the laminate film to singulate the support piece formation film;
   detaching and picking up the support pieces from the adhesive layer;
   disposing the first chip on the substrate;
   disposing the plurality of the support pieces around the first chip, on the substrate;
   separately providing the bonding adhesive piece-attached chip;
   disposing the bonding adhesive piece-attached chip on one or more surfaces of the plurality of the support pieces;
   thermally compressing the bonding adhesive piece-attached chip against the one or more surfaces of the plurality of the support pieces through the bonding adhesive piece; and
   curing the bonding adhesive piece to construct the dolmen structure.

2. The manufacturing method according to claim 1, wherein the plurality of the support pieces are disposed around the first chip by applying a thermal compression treatment.

3. The manufacturing method according to claim 1, wherein the compression treatment is performed at a temperature of 80 to 180° C. and a pressure of 0.01 to 0.50 MPa, for 0.5 to 3.0 seconds.

4. The manufacturing method according to claim 1, further comprising sealing a gap with a sealing material, between the first chip and the bonding adhesive piece-attached chip including the second chip.

5. The manufacturing method according to claim 4, wherein the gap is sealed with the sealing material after curing the bonding adhesive piece.

6. The manufacturing method according to claim 1, wherein the bonding adhesive piece is cured by a curing treatment performed at a temperature of 60 to 175° C. and a pressure of 0.01 to 1.0 MPa, for 5 minutes or more.

7. The manufacturing method according to claim 1, wherein after the bonding adhesive piece of the bonding adhesive piece-attached chip is thermally compressed against the support piece formation film to form the semiconductor device, a shear strength of the support piece formation film and the adhesive piece-attached chip at 250° C. is 3.2 MPa or more.

8. The manufacturing method according to claim 7, wherein the shear strength is measured at 250° C. after performing a curing treatment of the support piece formation film at a temperature of approximately 170° C. for 1 hour.

9. A manufacturing method for a semiconductor device having a dolmen structure, wherein the dolmen structure includes a substrate, a first chip disposed on the substrate, a plurality of support pieces disposed around the first chip on the substrate, and a bonding adhesive piece-attached chip, including a second chip and a bonding adhesive piece attached on one surface of the second chip, supported by the support pieces and disposed to cover the first chip, the method comprising:
    providing a laminate film including an adhesive layer located between a base material film and a support piece formation film, the support piece formation film including a three-layer film comprising a resin layer laminated between a first thermosetting resin layer and a second thermosetting resin layer, wherein the resin layer has a greater rigidity than either of the first thermosetting resin layer and the second thermosetting resin layer,
    forming the support pieces configured to support the bonding adhesive piece-attached chip, on a surface of the adhesive layer by dicing the support piece formation film of the laminate film to singulate the support piece formation film;
    detaching and picking up the support pieces from the adhesive layer;
    disposing the first chip on the substrate;
    disposing the plurality of the support pieces around the first chip, on the substrate;
    separately providing the bonding adhesive piece-attached chip;
    disposing the bonding adhesive piece-attached chip on one or more surfaces of the plurality of the support pieces;
    thermally compressing the bonding adhesive piece-attached chip against the one or more surfaces of the plurality of the support pieces through the bonding adhesive piece; and
    curing the bonding adhesive piece to construct the dolmen structure.

10. The manufacturing method according to claim 9, wherein the plurality of the support pieces are disposed around the first chip by applying a thermal compression treatment.

11. The manufacturing method according to claim 9, wherein the compression treatment is performed at a temperature of 80 to 180° C. and a pressure of 0.01 to 0.50 MPa, for 0.5 to 3.0 seconds.

12. The manufacturing method according to claim 9, further comprising sealing a gap with a sealing material between the first chip and the bonding adhesive piece-attached chip including the second chip.

13. The manufacturing method according to claim 12, wherein the gap is sealed with the sealing material after curing the bonding adhesive piece.

14. The manufacturing method according to claim 9, wherein the bonding adhesive piece is cured by a curing treatment performed at a temperature of 60 to 175° C. and a pressure of 0.01 to 1.0 MPa, for 5 minutes or more.

15. The manufacturing method according to claim 9, wherein after the bonding adhesive piece of the bonding adhesive piece-attached chip is thermally compressed against the support piece formation film to form the semiconductor device, a shear strength of the support piece formation film and the adhesive piece-attached chip at 250° C. is 3.2 MPa or more.

16. The manufacturing method according to claim 15, wherein the shear strength is measured at 250° C. after performing a curing treatment of the support piece formation film at a temperature of approximately 170° C. for 1 hour.

* * * * *